(12) United States Patent
Bell

(10) Patent No.: US 9,141,100 B2
(45) Date of Patent: Sep. 22, 2015

(54) SYSTEM AND METHOD FOR ESTIMATING PERFORMANCE METRICS OF CONSERVATION VOLTAGE REDUCTION (CVR) SYSTEMS AND VOLT/VAR OPTIMIZATION SYSTEMS

(71) Applicant: Utilidata, Inc., Providence, RI (US)

(72) Inventor: David Gordon Bell, Spokane, WA (US)

(73) Assignee: UTILITDATA, INC., Providence, RI (US)

( * ) Notice: Subject to any disclaimer, the term of this patent is extended or adjusted under 35 U.S.C. 154(b) by 0 days.

(21) Appl. No.: 14/106,505

(22) Filed: Dec. 13, 2013

(65) Prior Publication Data
US 2014/0107858 A1    Apr. 17, 2014

Related U.S. Application Data

(63) Continuation of application No. PCT/US2013/028670, filed on Mar. 1, 2013.

(60) Provisional application No. 61/605,609, filed on Mar. 1, 2012.

(51) Int. Cl.
| | |
|---|---|
| G05B 15/02 | (2006.01) |
| G05B 13/04 | (2006.01) |
| H02J 3/16 | (2006.01) |
| G01R 31/40 | (2014.01) |
| H02J 3/00 | (2006.01) |

(52) U.S. Cl.
CPC ............... *G05B 15/02* (2013.01); *G05B 13/04* (2013.01); *H02J 3/16* (2013.01); *G01R 31/40* (2013.01);
(Continued)

(58) Field of Classification Search
CPC .................................................. G01R 31/3181

USPC ....................... 700/298, 32, 50, 51; 703/4, 18
See application file for complete search history.

(56) References Cited

U.S. PATENT DOCUMENTS 6,597,958 B1 *  7/2003  Starr ............................... 700/29
8,437,883 B2   5/2013  Powell et al.
(Continued)

FOREIGN PATENT DOCUMENTS

KR    10-2005-0037714 A    4/2005

OTHER PUBLICATIONS

Kennedy et al., "Conservation Voltage Reduction (CVR) At Snohomish County PUD" Transactions on Power Systems vol. 6 No. 3 Aug. 1991. pp. 986-998.*

(Continued)

*Primary Examiner* — Mohammad Ali
*Assistant Examiner* — Emilio J Saavedra
(74) *Attorney, Agent, or Firm* — Foley & Lardner LLP; Christopher J. McKenna; Chethan K. Srinvasa

(57) ABSTRACT

Systems and methods of analyzing the performance of a conservation system for improving the performance of an electrical power delivery system are disclosed. In one implementation, the system receives first observation information indicative of the performance of the conservation system in a first mode, and second observation information indicative of the performance of the conservation system in a second mode. The system generates a first model of the performance of the conservation system in the first mode based on the first observation information, and a second model of the performance of the conservation system in the second mode based on the second observation information. The system determines first controlled performance information indicative of the performance of the conservation system in the first mode based on the first model, and second controlled performance information indicative of the performance of the conservation system in the second mode based on the second model.

28 Claims, 12 Drawing Sheets

(52) U.S. Cl.
CPC ............ *H02J 2003/007* (2013.01); *Y02E 40/34* (2013.01); *Y02E 60/76* (2013.01); *Y04S 40/22* (2013.01)

(56) References Cited

U.S. PATENT DOCUMENTS

| | | | |
|---|---|---|---|
| 8,577,510 B2 | 11/2013 | Powell et al. | |
| 2010/0114400 A1* | 5/2010 | Feng et al. | 700/298 |
| 2010/0286840 A1* | 11/2010 | Powell et al. | 700/295 |
| 2011/0077878 A1 | 3/2011 | Lathrop et al. | |
| 2011/0231124 A1 | 9/2011 | Itabashi | |
| 2014/0265574 A1 | 9/2014 | Tyler et al. | |
| 2014/0277796 A1 | 9/2014 | Peskin et al. | |
| 2014/0277813 A1 | 9/2014 | Powell et al. | |
| 2014/0312693 A2 | 10/2014 | Powell et al. | |

OTHER PUBLICATIONS

Alhoniemi et al.,"Process Monitoring and Modeling Using Self-Organizing Map" Journal Integrated Computer-Aided Engineering vol. 6 Issue 1 Jan. 1999. pp. 3-24.*

PCS UtiliData Verification Protocol for Automated Conservation Regulation Systems Presentation, Feb. 10, 2004.*

Wilson "Measurement and Verification of Distribution Voltage Optimization Results for the IEEE Power & Energy Society" 2010 IEEE Power and Energy Society General Meeting. Jul. 25-29, 2010, pp. 1-9.*

Schneider et al., "Evaluating Conservation Voltage Reduction: An Application of GridLAB-D: an Open Source Software Package" 2011 IEEE Power and Energy Society General Meeting. Jul. 24-29, 2011 pp. 1-6.*

Bell, "Estimation of Automated CVR System Performance—continuation", PCS Utilidata, Feb. 9, 2004, pp. 1-7.*

International Search Report and Written Opinion mailed Jun. 27, 2013 in PCT Application No. PCT/US2013/028670.

Khurmy, M, et al. Measurement & verifications of voltage optimization for conserving energy, Environment and Electrical Engineering (EEEIC), 2011 10th International Conference, Rome May 8-11, 2011, pp. 1-5.

Wilson, T.L., Energy conservation with voltage reduction—fact or fantasy, Rural Electric Power Conference, Colorado SProngs: IEEE, 2001, pp. C3-C3_6.

* cited by examiner

SYSTEM AND METHOD FOR ESTIMATING PERFORMANCE METRICS OF CONSERVATION VOLTAGE REDUCTION (CVR) SYSTEMS AND VOLT/VAR OPTIMIZATION SYSTEMS

CROSS-REFERENCE TO RELATED APPLICATIONS

The present application claims the benefit of International Application PCT/US2013/028670, with an international filing date of Mar. 1, 2013, which claims the benefit of U.S. Provisional Application No. 61/605,609, filed Mar. 1, 2012, the entire contents of which are incorporated herein by reference.

The technology described in this application can be used in conjunction with any of the technology described in the following patents and patent applications, each of which are hereby incorporated by reference: U.S. Pat. No. 8,390,227 filed Aug. 13, 2009; U.S. patent application Ser. No. 12/540, 364 filed Aug. 13, 2009; U.S. patent application Ser. No. 13/369,794 filed Feb. 9, 2012; U.S. Provisional Patent Application No. 61/441,224 filed Feb. 9, 2011; International Patent Application No. PCT/US2012/024519 filed Feb. 9, 2012; U.S. Provisional Patent Application No. 61/605,609 filed Mar. 1, 2012; U.S. Pat. No. 7,729,810 filed Apr. 4, 2006; Canadian Patent Application No. 2649838 filed Apr. 6, 2006; U.S. Provisional Patent Application No. 61/680,960 filed Aug. 8, 2012; and U.S. Provisional Patent Application No. 61/761,180 filed Feb. 5, 2013.

FIELD

The present disclosure relates to estimating the performance of an energy conservations system, e.g., the magnitude of conserved energy resulting from a small reduction in the delivered voltages from a power source. Some embodiments relate to estimating performance metrics of conservation voltage reduction (CVR) systems and VOLT/VAR optimization systems.

BACKGROUND

The following section is presented for informational purposes only, and should not be considered as an admission that any of the material found in this section is prior art to the present application.

In various applications, it is advantageous to apply conservation systems and methods to the operation of an electrical power distribution system. For example, conservation voltage reduction (CVR) is a reduction of energy consumption resulting from a reduction of feeder voltage. Some implementations of CVR schemes contain one or both of two fundamental components: reactive power compensation and voltage optimization. Reactive power compensation may be achieved through the operation of shunt capacitors in order to maintain the power factor at the substation transformer within a prescribed band. Voltage optimization may be achieved through the operation of substation voltage regulators in order to regulate the voltage at specific End of Line (EOL) points within a prescribed range. In this way the peak load is reduced and the overall energy consumption is reduced.

In some embodiments, CVR operates by saving electrical energy by operating electric distribution systems at voltages in the lower portions of a range of allowable levels, thereby improving the efficiency of many electric utilization devices. Many if not all utilization devices operate more efficiently in the lower portion of their designed voltage range. If those devices, motors, drives, electronic power supplies, transformers, lighting systems, etc. are applied properly, that is if they are not undersized for their application, virtually all will operate more efficiently. Conservation Voltage Regulation Factor (CVRf) is a measure of energy conservation when voltage optimization is implemented. CVRf=$\Delta$E %/$\Delta$V % where $\Delta$E % is the percent of energy reduced and $\Delta$V % is the percent voltage reduction.

Another conservation technique is volt/VAR optimization (VVO). VVO may be implemented in "smart grid" systems, where information regarding the electrical power distribution system (e.g., acquired using an automated metering infrastructure) is processed and used to control, e.g., capacitor banks and voltage regulation in a coordinated manner to provide optimal voltage and reactive power usage.

Exemplary CVR and VVO systems are available under the AdaptiVolt™ product line from Utilidata, Inc.

SUMMARY

A method and apparatus for estimating performance metrics of a conservation system, such as a CVR system and/or VOLT/VAR optimization systems is disclosed.

In one aspect, a method is disclosed of analyzing the performance of a conservation system for improving the performance of an electrical power delivery system, the method including: receiving first observation information indicative of the performance of the conservation system in a first mode; receiving second observation information indicative of the performance of the conservation system in a second mode; generating a first model of the performance of the conservation system in the first mode based on the first observation information; generating a second model of the performance of the conservation system in the first mode based on the first observation information; determining first controlled performance information indicative of the performance of the conservation system in the first mode based on the first model; and determining second controlled performance information indicative of the performance of the conservation system in the second mode based on the second model.

In some embodiments, the conservation system includes a conservation voltage reduction (CVR) system or a Volt/VAR optimization (VVO) system.

In some embodiments, the first mode is a mode where the conservation system is inactive and the second mode is a mode where the conservation system is active.

Some embodiments include controlling the conservation system to operate in the first and second modes.

Some embodiments include detecting at least a portion of the first and second observation information.

In some embodiments, each of the first and second observation information includes: explanatory information indicative of at least one explanatory variable for the performance of the conservation system; and dependent information indicative of at least one dependent variable for the performance of the conservation system.

In some embodiments, the explanatory information includes information indicative of at least one selected from the list consisting of: temperature, humidity, solar conditions, exposure, population, weather conditions, and linear or non-linear combinations of any of the foregoing.

In some embodiments, where the dependent information includes information indicative of at least one selected from the list consisting of: operating voltage, real voltage demand, VAR demand, or combinations thereof.

In some embodiments, generating each of the first and second models includes: performing a regression based on the respective explanatory information and the dependent information.

In some embodiments, performing the regression includes performing a multiple linear regression.

In some embodiments, performing the regression includes applying a robust regression algorithm.

In some embodiments, at least one variable subject to the regression corresponds to a random variable having a non-Gaussian distribution, and the robust regression algorithm compensates for the non-Gaussian distribution.

In some embodiments, performing the regression includes applying a minimum covariance determinant (MCD) algorithm.

Some embodiments include sorting each of the first and second observation information into at plurality of categories. In some embodiments, generating the first model of the performance of the conservation system in the first mode includes performing separate respective regressions based on the first observation information from each of the plurality of categories; and generating the second model of the performance of the conservation system in the second mode includes performing separate respective regressions based on the second observation information from each of the plurality of categories.

In some embodiments, the observation information within each of the categories exhibits substantially linear behavior.

In some embodiments, the observation information exhibits substantially non-linear behavior from category to category.

In some embodiments, each of the plurality of categories correspond to observations corresponding to a common physical condition.

In some embodiments, the physical condition includes at least one selected from the list consisting of: temperature, humidity, solar conditions, exposure, and weather conditions.

In some embodiments, each of the plurality of categories corresponds to observations corresponding to a common usage condition.

In some embodiments, where the usage condition corresponds to a user population or a user population density.

In some embodiments, the plurality of categories includes at least three categories. In some embodiments, the at least three categories include a low temperature category including observations corresponding to a zone with relatively low ambient temperatures; a high temperature zone corresponding to a zone with relatively high ambient temperatures; and a moderate corresponding to a zone with ambient temperatures intermediate between the low and high temperature zones. In some embodiments, the low temperature category corresponds to a zone where power from the delivery system is used for heating. In some embodiments, the high temperature category corresponds to a zone where power from the delivery system is used for cooling.

Some embodiments include comparing the performance of the conservation system in the first and second modes using the controlled performance information. In some embodiments, comparing the performance of the conservation system in the first and second modes includes using the first and second models to control for differing delivery system operating conditions in the first and second modes. In some embodiments, the differing operating conditions include at least one from the list consisting of: temperature, humidity, solar conditions, exposure, population, weather conditions, and linear or non-linear combinations of any of the foregoing.

In some embodiments, the conservation system is a CVR system and comparing the performance of the conservation system in the first and second modes includes generating information indicative of a CVR factor.

In some embodiments, the conservation system is a Volt/VAR optimization system and comparing the performance of the conservation system in the first and second modes includes generating information indicative of energy efficiency or demand response.

In another aspect, a system is disclosed for analyzing the performance of a conservation system for improving the performance of an electrical power delivery system, the system including: a processor configured to implement any of the foregoing methods.

Some embodiments include a plurality of sensors operatively coupled to the processor and configured to generate the observation information. In some embodiments, the plurality of sensors includes one or meters located remotely from the processor and in operative communication with the processor.

Some embodiments include an automated metering infrastructure system includes one or more of the plurality of sensors.

In some embodiments, the plurality of sensors includes one or more sensors configured to monitor electrical power delivery at one or more locations in the delivery system.

In some embodiments, the one or more sensors configured to monitor electrical power delivery includes a sensor configured to measure the voltage or VAR level at a location in the delivery system.

In some embodiments, the plurality of sensors includes one or more sensors configured to physical conditions at one or more locations in the delivery system.

In some embodiments, the sensors include at least one selected from the list consisting of: a temperature sensor, a humidity sensor, a solar condition sensor, an exposure sensor, a population sensor, a weather condition sensor, and combinations of any of the foregoing.

In some embodiments, the processor is in communication with at least one database storing information indicative of physical conditions at one or more locations in the delivery system. In some embodiments, the database stores weather or climate information.

Some embodiments include a controller operatively connected to the processor, and configured to control the operation of the conservation system.

Some embodiments include the conservation system. In some embodiments, the conservation system includes a conservation voltage reduction (CVR) system or a Volt/VAR (VVO) optimization system. In some embodiments, the conservation system operates in a first mode where the conservation system is inactive and a second mode where the conservation system is active. In some embodiments, the conservation system operates in a first mode having a first set of operating parameters and a second mode having a second set of operating parameters.

In another aspect, a non-transitory computer readable media with an executable program stored thereon, where the program instructs a processor to implement the steps any of the foregoing methods.

A process is described in which performance metrics of conservation voltage reduction (CVR) systems or Volt/VAR optimization systems are analyzed. In the system, a computing device individually estimates CVR factors in identified temperature zones. In one implementation, the computing device combines in estimates using variables obtained from a CVR system or a Volt/VAR optimization system. In another implementation, the computing device estimates CVR factors using those variables. The computing device can then use the estimates to obtain future power forecasts of the CVR system or the Volt/VAR optimization system based on climate.

Various embodiments may include any of the above described features, either alone or in any suitable combination.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different figures indicates similar or identical items.

DETAILED DESCRIPTION

Figure 1:
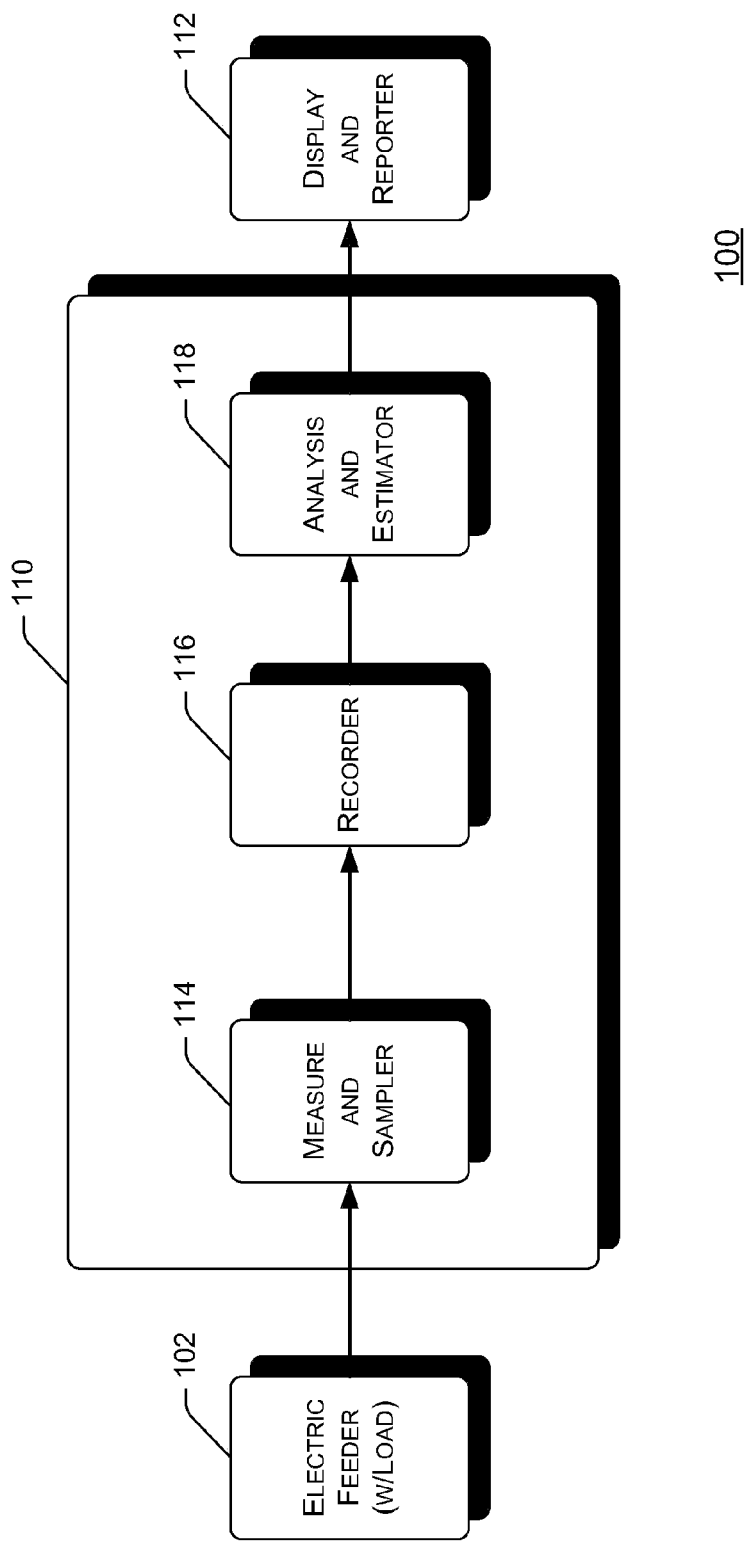
FIG. 1 is a simplified schematic diagram of a system for estimating conservation voltage reduction (CVR) factors.

In various embodiments, it may be desirable to characterize the performance of a conservation system, such as a CVR or VVO system used to improve (or otherwise modify) the performance of an electrical power distribution system. A rough estimate of performance may be provided by simply monitoring overall power use during a period where the conservation system is active, and comparing it to the power use during a period when the system is turned off. However, this estimate will likely be inaccurate due to uncontrolled changes in the operating conditions of the distribution system (e.g., changes in temperature, humidity, solar conditions, exposure conditions, user population changes, etc.).

Accordingly, it would be desirable to provide a system and method for characterizing the performance of a conservation system that at least partially control for these changes in operating conditions. For example, in some embodiments, a system may conduct experiments with the conservation system active and inactive (or in two or more different active states having different operating parameters). During these experiments, the performance of the distribution system is measured (e.g., using an automated metering infrastructure, and/or sensors located at various substations or other points in the system), along with information indicative of the operating conditions of the system. This information can be used to develop models of the conservation system performance in each mode that control for one or more operating conditions.

For example, in some embodiments, the operating condition information can be used to generate explanatory variables, and the performance measurements used to generate corresponding dependant variables. The explanatory and dependent variable information can them be analyzed, e.g., using multiple linear (ML) regression techniques to generate a predictive model of the conservation system performance that controls for changes in the operating conditions.

Separate models can be generated for different conservation system modes (e.g., active and inactive). The performance in these modes can then be accurately compared by using the models to account for variations in operating conditions between the modes.

In some embodiments, the data being analyzed may have properties that complicate the analysis. For example, in some embodiments, the data will be characterized by a non-Gaussian probability distribution and/or may contain outliers. Non-Gaussian distributions may be asymmetric, may feature "fat tails" or may vary in other ways from a Gaussian distribution. In addition or in the alternative, in some cases, the collection of random variables under analysis may be heteroscedastic.

In such cases, standard regression techniques (e.g., based on the least squares approach familiar in the art) may fail when applied to the acquired observation data. Accordingly, in various embodiments, the regressions may be performed using one or more "robust" regression techniques known in the art. For example, in some embodiments, as detailed below, a minimum covariance determinant method may be used.

In various embodiments, other robust regression techniques may be used including least squares alternatives such as M-estimator techniques (e.g., as described in Huber, Peter J. (2009). Robust Statistics (2nd ed.). Hoboken, N.J.: John Wiley & Sons Inc.), Least Trimmed Squares techniques (e.g., as described in Rousseeuw, P. J. and Leroy, A. M. (1987). Robust Regression and Outlier Detection. Wiley-Interscience, New York.), assymetrical least squares techniques (e.g., as described in Newey, W. K and Powell, J. L., Asymmetric Least Squares Estimation and Testing, Econometrica 55 4 (1987)), and Least Absolute Deviation techniques (e.g., as described in Li Wang, Michael D. Gordon and Ji Zhu (December 2006). "Regularized Least Absolute Deviations Regression and an Efficient Algorithm for Parameter Tuning". Proceedings of the Sixth International Conference on Data Mining. pp. 690-700 and Branham, R. L., Jr., "Alternatives to least squares", Astronomical Journal 87, June 1982, 928-937.)

In some embodiments, the overall set of observed data may exhibit non-linear behavior that is not suitable for regression analysis. In some such cases, it may be advantageous to categorize the data into subsets that are "locally" linear (i.e., exhibit linear behavior for data within the subset), and then perform regressions separately on each subset of data. For example, as detailed below, this approach may be suitable in situations where portions of the observed data are acquired in different climate zones where the distribution system experiences qualitatively different conditions. In other cases, the categorization may be temporal or usage based in nature. For example, for a distribution system that provides power to an area having seasonal population shifts (e.g., a college campus), the data may be grouped based on the seasonal population level.

In various embodiments, the observation data for each experiment may be acquired using any suitable technique. For example, in some cases the data is acquired using one or more sensors distributed throughout the distribution system (e.g., incorporated in an automated metering infrastructure). In other cases, the observations may be indirect. For example, the temperature, humidity, or other weather conditions for a particular time and location in the system may be acquired and/or extrapolated or interpolated from a data source, such a weather database.

Referring to FIG. 1, there is shown an estimation system 100 for estimating the performance of a conservation system (e.g. for estimating CVR factors for a CVR system). The system includes an electric feeder 102 connected via controller 110 to display and reporter 112. Controller 110 includes a measure and sampler 114 connected via recorder 116 to analysis and estimator 118.

Controller 110 includes a processor having processing capabilities and a memory suitable to store and execute computer-executable instructions. In one example, Controller 110 includes one or more processors and memory, e.g., of any of the types described below.

Stored in the memory of the Controller 110 may include an application that includes modules containing instructions for execution by the processor. Details of the application executed by processor are described herein in connection with FIGS. 2-10.

Electric feeder 102 is coupled to loads or other sensors within a power grid. Measure and sampler 114 measures and samples the electric feeder 102 and stores the resultant measurement and sample using recorder 116. Analysis and estimator 118 retrieves the resultant measurement and sample to computer CVR factors, using the process described in connection with FIGS. 2-10 and displays/reports the results using display and reporter 112. In one implementation, the results are fed to a power generator or utility to evaluate system performance and estimate demand.

Illustrated in FIGS. 2-10, is a process executed by an exemplary controller 110 to for estimating conservation voltage reduction (CVR) factors. The exemplary process in FIG. 2-FIG. 10 are illustrated as a collection of blocks in a logical flow diagram, which represents a sequence of operations that can be implemented in hardware, software, and a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. For discussion purposes, the processes are described with reference to FIGS. 2-12, although it may be implemented in other system architectures.

Referring to FIGS. 2-10, a process 200 is shown to generate with the destination controller 110. In block 202, a system operator decides to conduct an experiment and analyze the observations to estimate CVR factors and other metrics. The system operator uses a computer to provide a signal to controller 110 to analyze CVR {see note above}. The decision may originate with a user or an automated device, such as a computer.

In block 204, an experiment entry point is defined. If there is no experiment defined, no records would be available for processing. If the experiment is running, defined records would be available.

In block 206, a determination is made whether there are sufficient records for processing. If there are sufficient records for processing in block 208 a determination is made whether there is an incremental analysis being conducted. If there is an incremental analysis, in block 210 (FIG. 5), the experiment records are processed. If there is not an incremental analysis, in block 216, a determination is made whether the increment is available.

Figure 3:
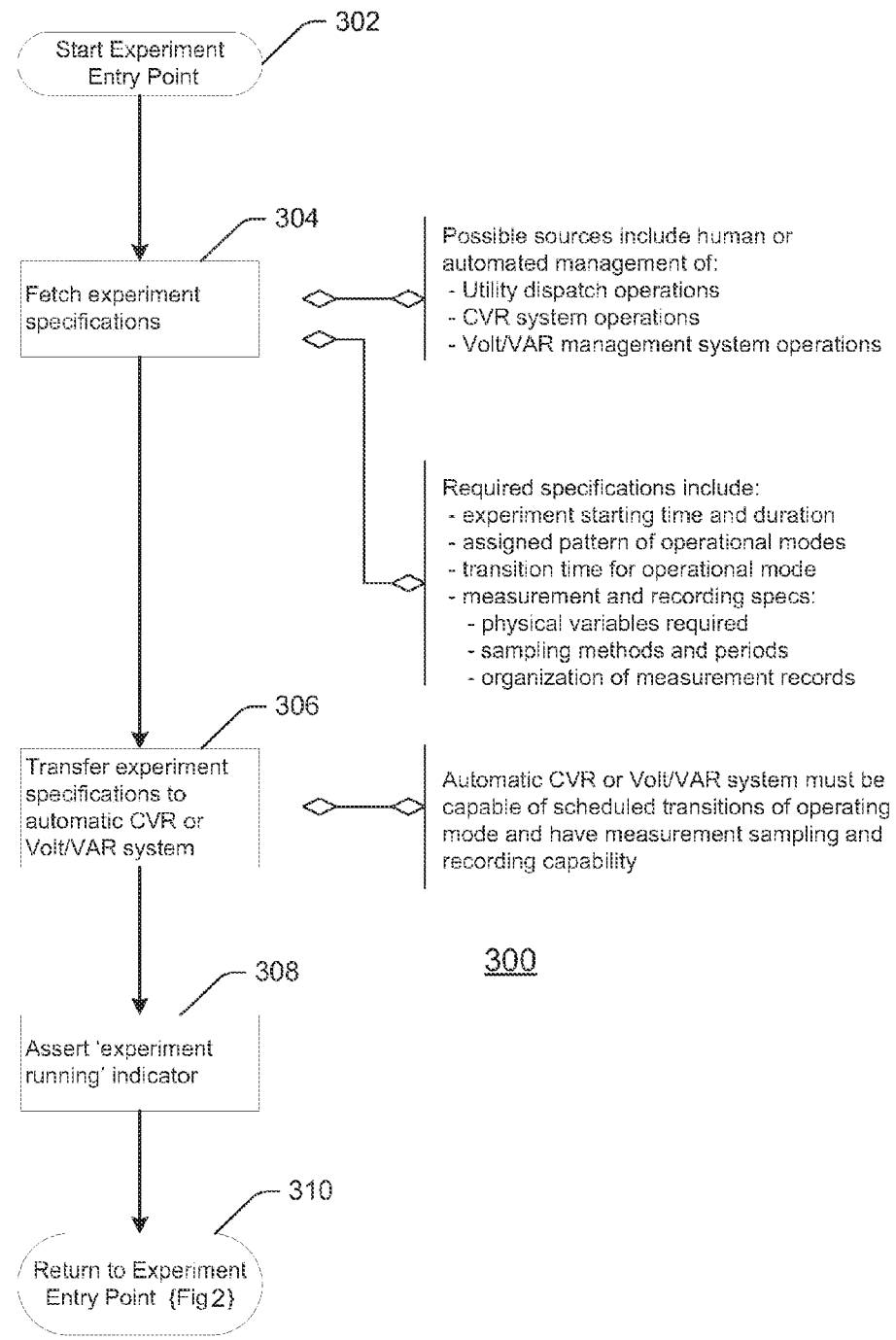
Figure 4:
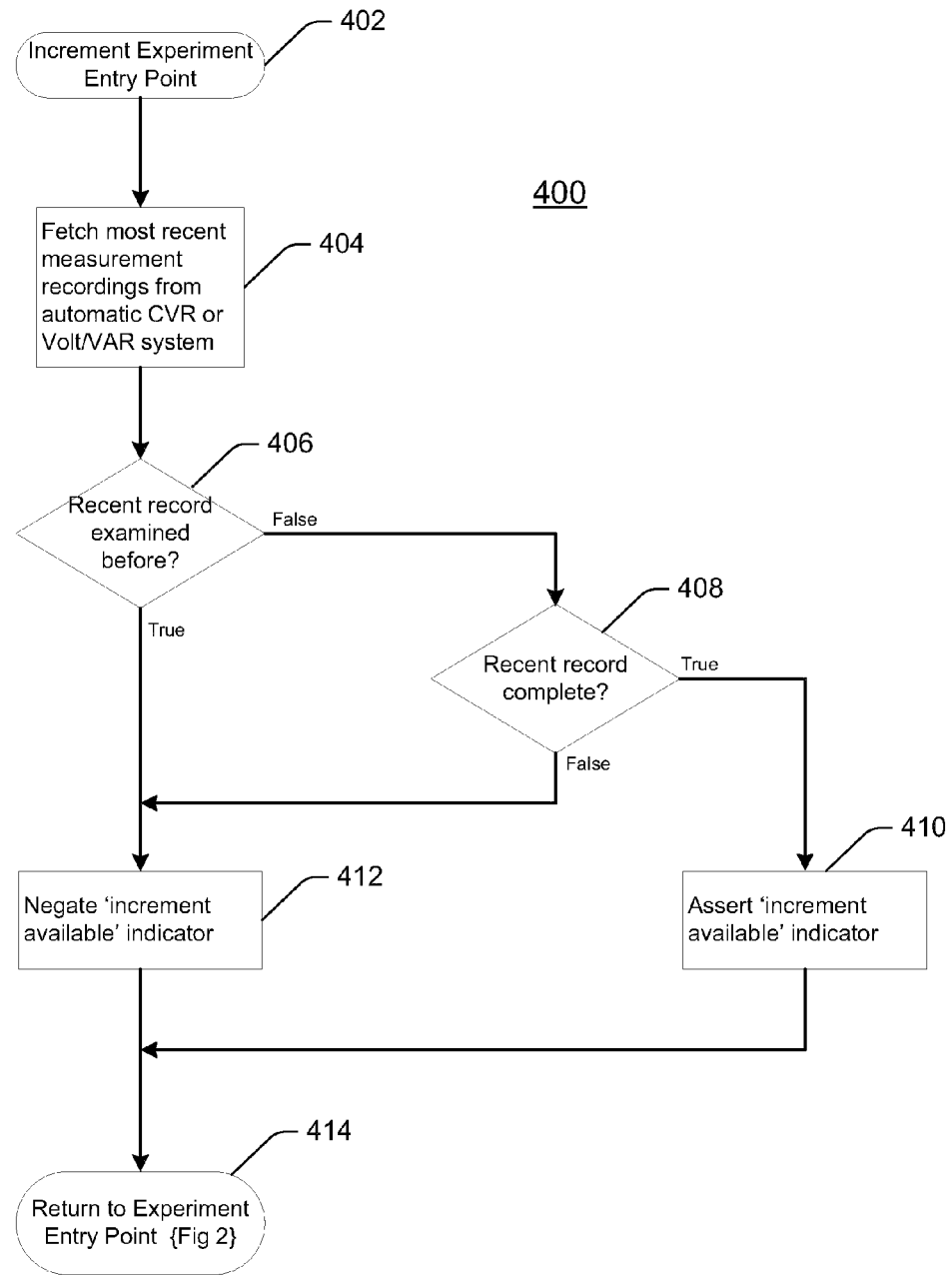

If there are not sufficient records for processing, in block 212, a determination is made as to whether the experiment is running. If the experiment is not running, the experiment is started in block 214 (FIG. 3). If the experiment is running or the increment, as determined in block 216 is not available, the experiment is incremented in block 220 (FIG. 4).

If the increment is available as determined in block 216, an increment available indicator is negated in block 218 and the experiment records are processed in block 210.

Referring to FIG. 3, there is shown process 300 for starting the experiment. In block 302 a start experiment entry point is defined and in block 304 experiment specifications are fetched from memory or other sources. Sources may include, but are not limited to, a user, and automated device that manages utility dispatch operations, CVR system operations or Volt/VAR management system operations. In one implementation, the required specifications would include experiment starting time and duration, the assigned pattern of operational modes, utility transmission or distribution circuit operational settings related to CVR and/or Volt/VAR, transition time for the operational modes, measurement and recording specifications. Such specifications may define the physical variable required, the sampling methods and periods, and the organization of the measurement records.

In block 306, experiment specifications are transferred to the automatic CVR or Volt/VAR systems. In one implementation, the automatic CVR or Volt/VAR system must be capable of scheduled transitions of operating mode and have measurement sampling and recording capability.

Figure 2:
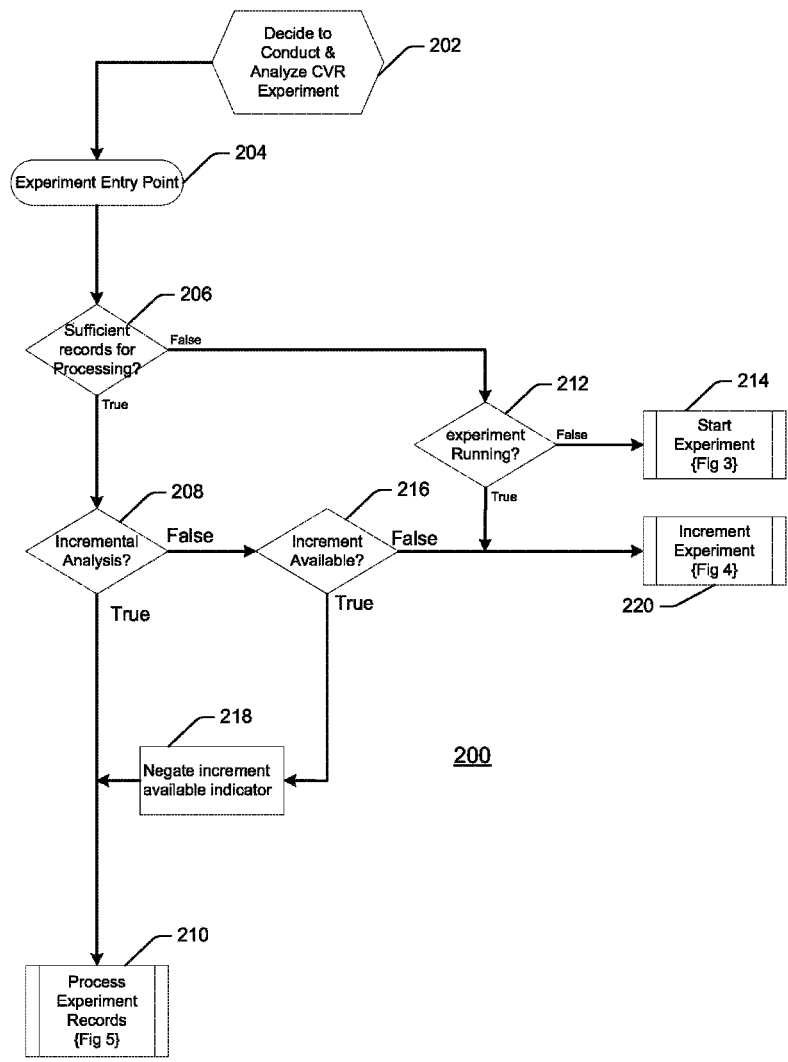
FIGS. 2-10 are a flow chart illustrating a process executed by a computing device for estimating conservation voltage reduction (CVR) factors.

In block 308, and experiment running indicator is asserted, and in block 310, the process returns to the experiment entry point 202 in FIG. 2.

Referring to FIG. 4, there is shown process 400 for incrementing the experiment. In block 402, an increment experiment entry point is defined. In block 404, the most recent measurement recording from the automatic CVR or Volt/VAR system is fetched.

In block 406, a determination is made whether the recent records were examined before. If they were not examined before, in block 408 a determination is made whether the recent records are complete. If they are complete, in block 410, the increment available indicator is asserted. If the recent records are not complete as determined in block 408, or if the recent records were examined before, in block 412 the increment available indicator is negated.

After negating the increment available indicator in block 412, or asserting the increment available indicator in block 410, the process returns to the experiment entry point in block 414 (block 202 of FIG. 2).

Figure 5:
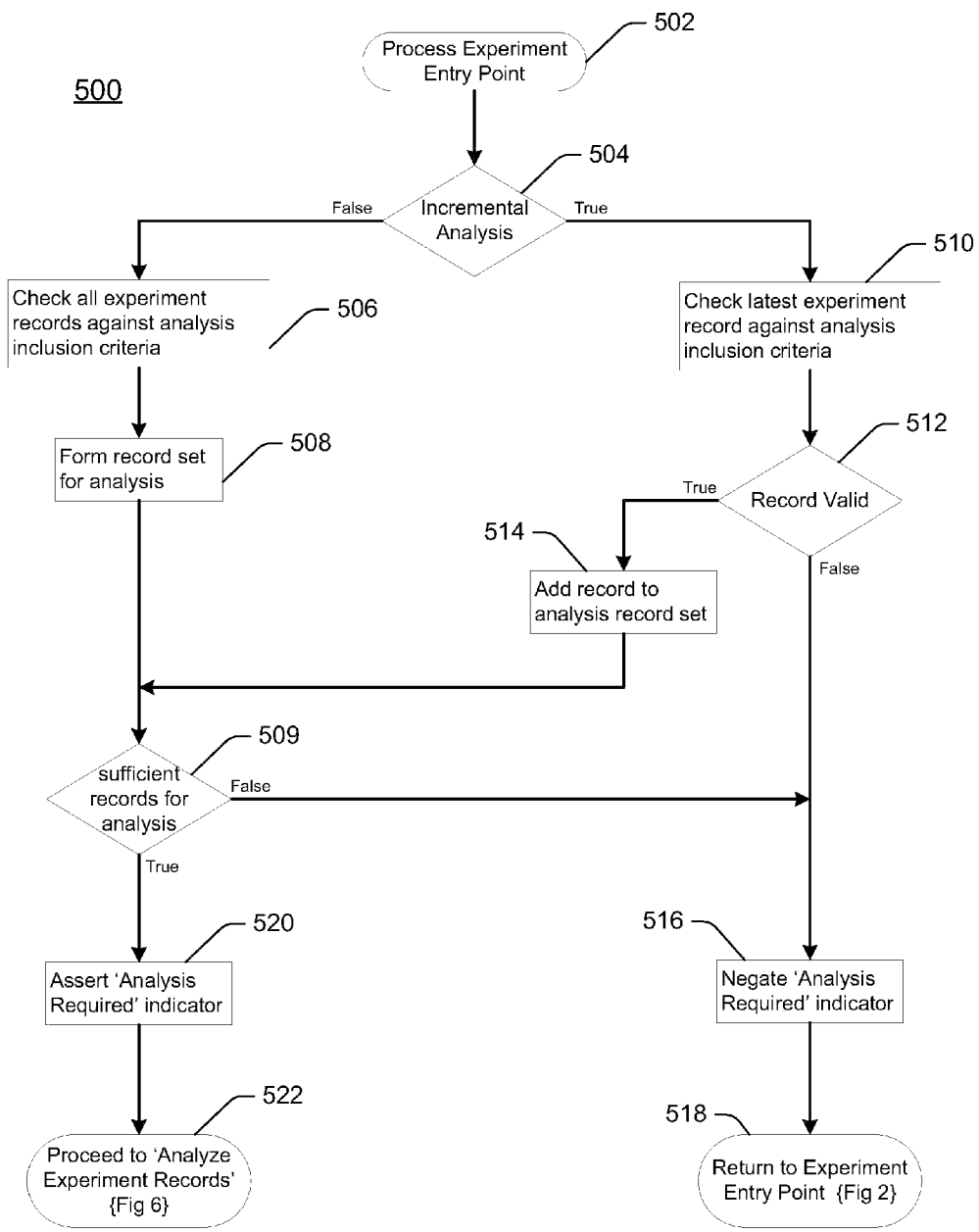

Referring to FIG. 5, there is shown process 500 for processing experimental records. In block 502, a process experiment entry point is defined. In block 504, a determination is made whether incremental analysis has been conducted.

If incremental analysis has not been conducted, in block 506 all the experiment records are checked against an analysis inclusion criteria. In block 508, a form record is set for analysis and in block 509, a determination is made whether there are sufficient records for analysis.

If the incremental analysis has been conducted, in block 510, the latest experiment records are checked against analysis inclusion criteria. In block 512, a determination is made whether the records are valid. If the records are valid, in block 514, the records are added to an analysis record set and a determination is made whether there are sufficient records for analysis in block 509. If they are not valid, the analysis required indicator is negated in block 516, and the process returns to the experiment entry point 518 (FIG. 2, 202) If they are valid, in block 520 an analysis required indicator is asserted and in block 522, the experiment records are analyzed (FIG. 6).

Figure 6:
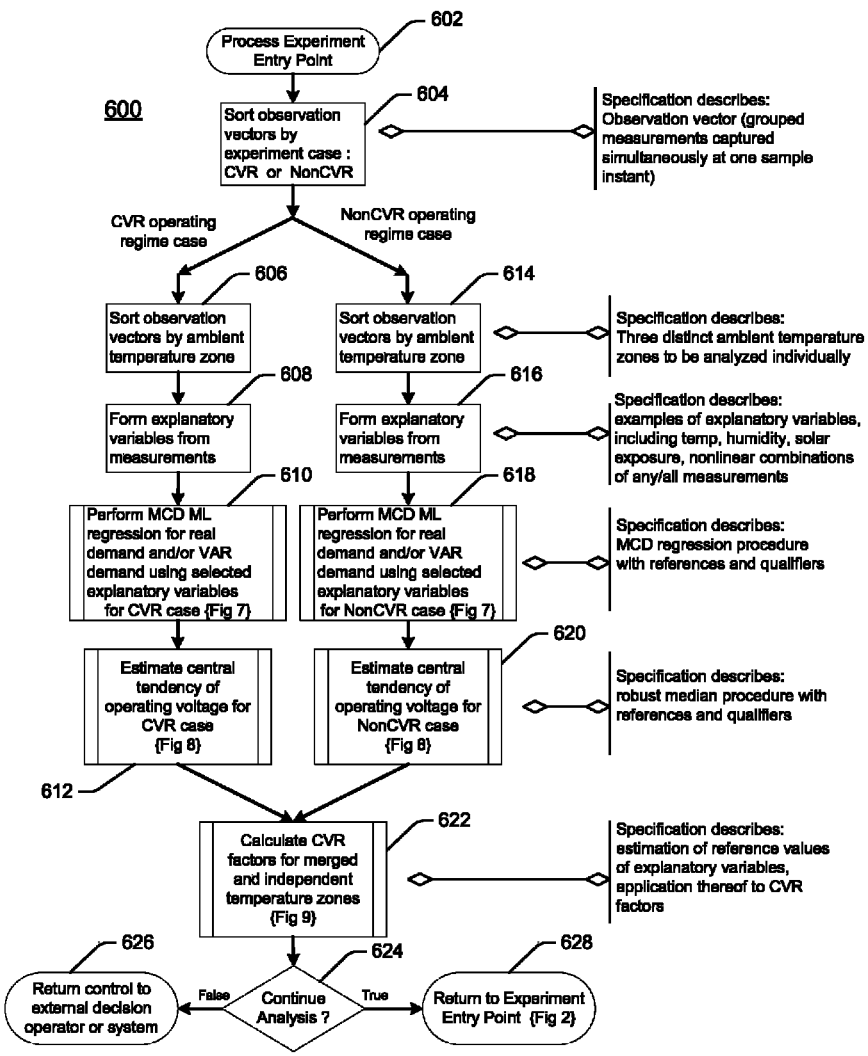

Referring to FIG. 6, there is shown process 600 for processing experimental records. In block 602, a process experiment entry point is defined. In block 604, observation vectors are sorted by experiment case, e.g. CVR or non-CVR. In one implementation, observation vector is a group of measurements captured simultaneously at one sample instant.

Note that although in the example shown, experiments are conducted for CVR and non-CVR case, in general the experiments may be performed with CVR operating in different modes with different applied operation parameters. In general any number of different modes may be analyzed.

If the experiment case is CVR, then blocks 606-612 are executed, if the experiment case is a non-CVR, then block 614-620 are executed.

In block 606, the observations vectors are sorted by ambient temperature zone. In one implementation, three distinct ambient temperature zones are analyzed individually.

In block 608, explanatory variables are formed from the measurements. Examples of explanatory variables include, but are not limited to, temperature, humidity, solar, exposure, non-linear combinations of any/all measurements.

Figure 7:
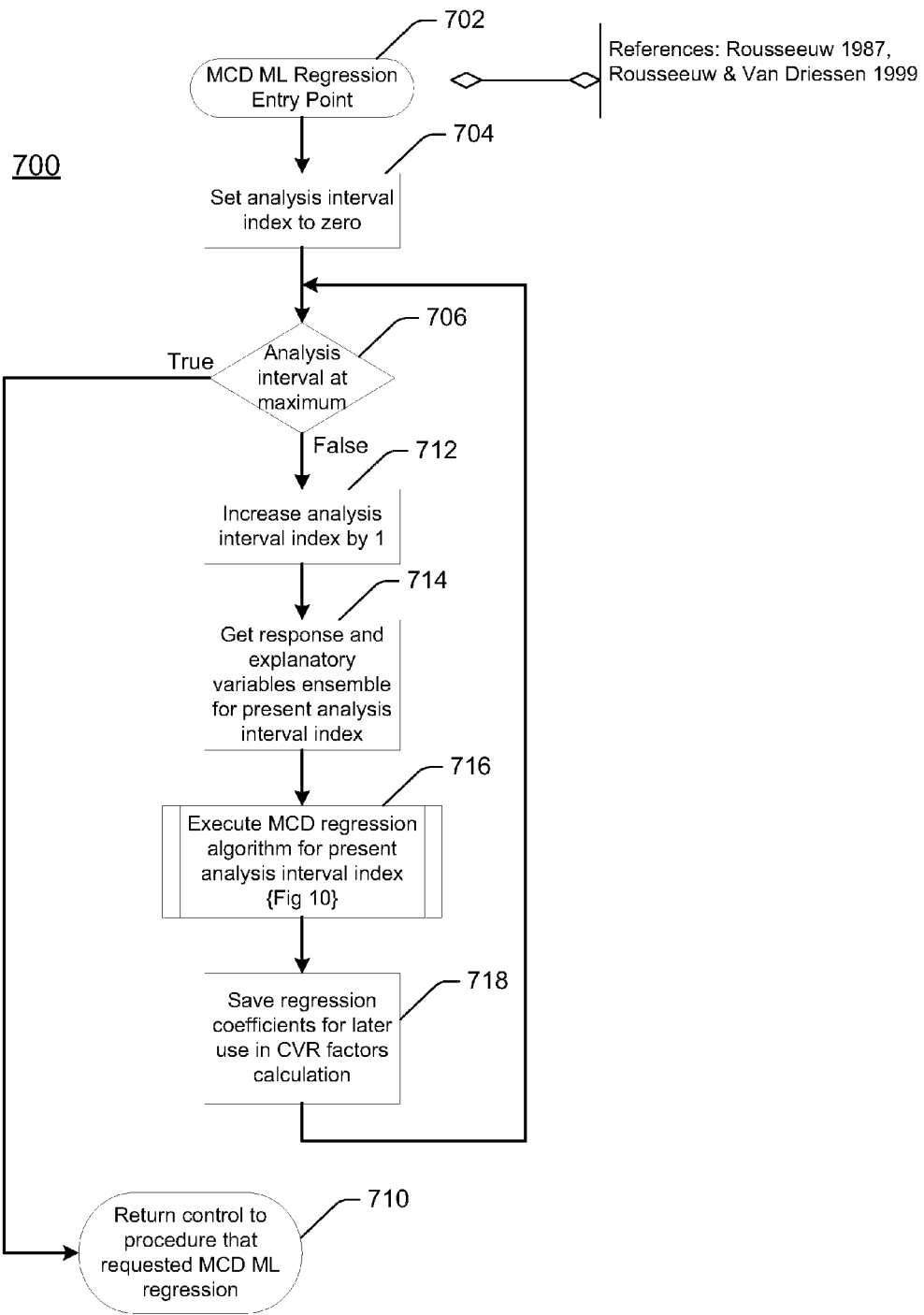

In block 610, MCD ML regression for real demand and/or VAR demand is performed using selected explanatory variables for the CVR operating regime case. The details of the MCD ML regression are shown in FIG. 7.

Figure 8:
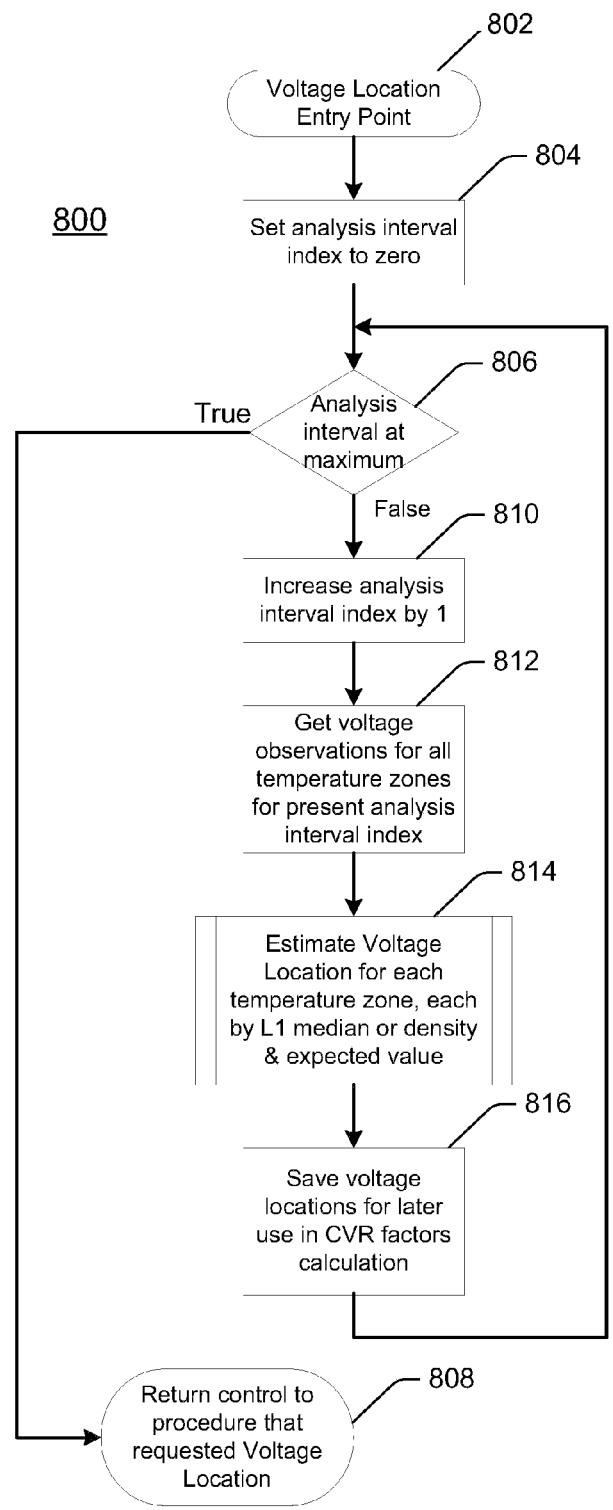

In block 612, a central tendency of the operating voltage for the CVR Case is estimated. The details of the MCD ML regression are shown in FIG. 8. The process then proceeds to block 622.

In block 614, the observations vectors are sorted by ambient temperature zone. In one implementation, three distinct ambient temperature zones are analyzed individually.

In block 616, explanatory variables are formed from the measurements. Examples of explanatory variables include, but are not limited to, temperature, humidity, solar, exposure, and linear or non-linear combinations of any/all measurements as motivated by the expected physical influence of the explanatory variable(s).

In block 618, MCD ML regression for real demand and/or VAR demand is performed using selected explanatory variables for the non-CVR operating regime case. The details of the MCD ML regression for the non-CVR operating regime case are shown in FIG. 7.

In block 620, a central tendency (e.g., mean, median, mode, geometric mean, harmonic mean, weighted mean, truncated mean, or any other suitable metric) of the operating voltage for the non-CVR case is estimated. The details of the MCD ML regression for the non-CVR operating regime case are shown in FIG. 8. The process then proceeds to block 622.

In block 622, CVR factors for merged and independent temperature zones are calculated. The details of the calculation process are shown in FIG. 9. An estimation of reference values of explanatory variables and application to CVR factors is shown in FIG. 9.

In block 624, a determination is made whether to continue the analysis. If the analysis is to be continued, then the process in block 628 returns to the experiment entry point 202 of FIG. 2. If the analysis is not to be continued, then in block 626, control is returned to a user, an external decision operator, or a computing device 110.

Referring to FIG. 7, there is shown process 700 for multiple linear regressions by an MCD method. In block 702, an MCD ML regression entry point is defined. Exemplary implementations of an MCD ML regression is described in Rousseeuw, P. J., and Leroy, A. M., 'Robust Regression and Outlier Detection', Wiley 1987, and Peter J. Rousseeuw and Katrien Van Driessen, 'A Fast Algorithm for the Minimum Covariance Determinant Estimator', 1998.

In block 704, the analysis interval index is set to zero.

In block 706, a determination is made whether the analysis interval is at maximum. If it is, control is returned in block 710, to the procedure that requested the MCD ML regression. If it is not, in block 712 the analysis interval index is increased by one.

In block 714, response and explanatory variables ensemble is retrieved for the present analysis interval index.

Figure 10:
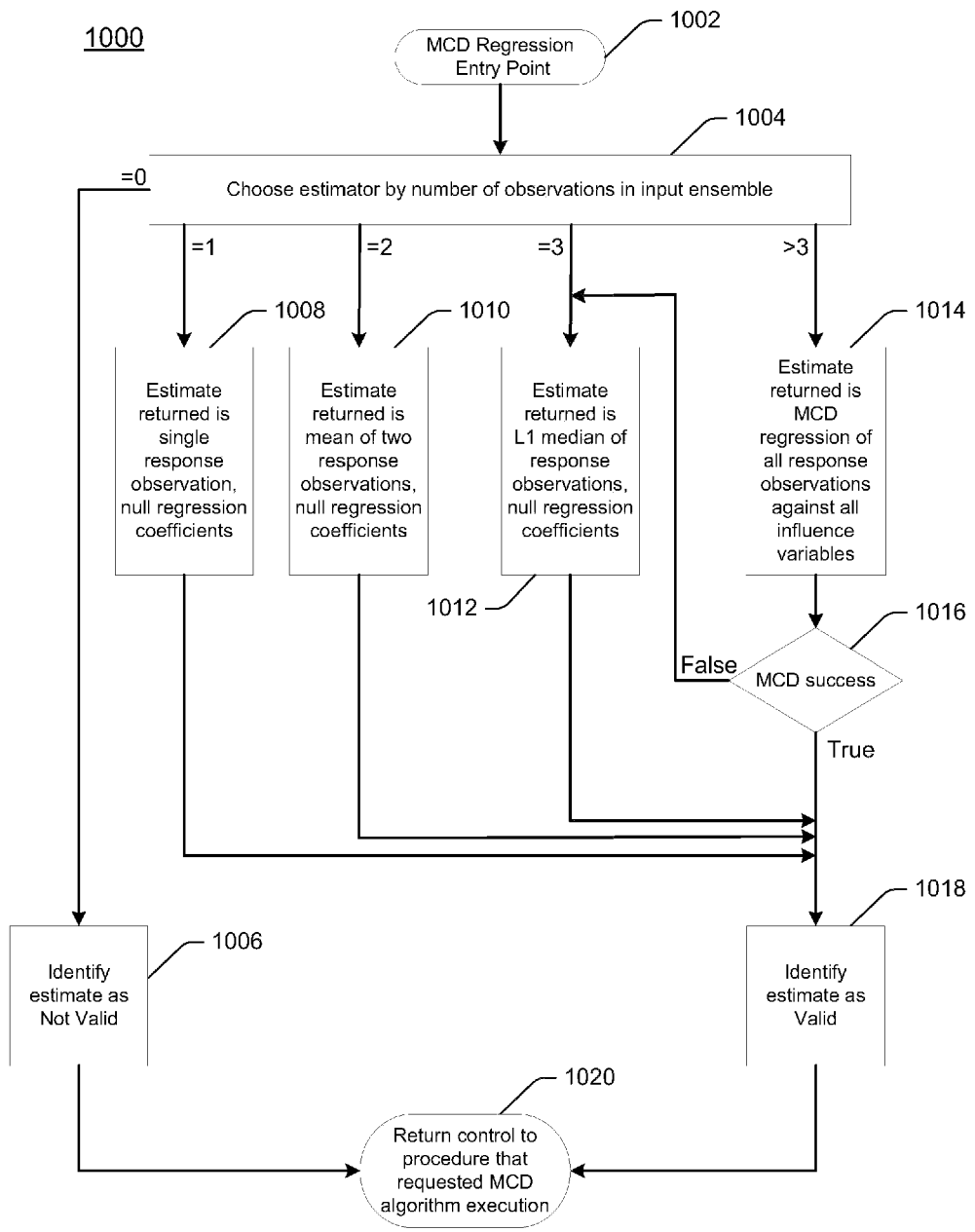

In block 716, the MCD regression algorithm for the present analysis interval is executed. Further details of the process for executing the MCD regression algorithm is shown in FIG. 10.

In block 718, the regression coefficients for later use in the CVR factors calculation is saved. Process 706 is executed to determine whether the analysis interval is at maximum.

Referring to FIG. 8, there is shown process 800 for estimating the voltage statistical location. In block 802, a voltage location entry point is defined.

In block 804, an analysis interval index is set to zero.

In block 806, a determination is made whether the analysis interval is a maximum level. If it is, in block 808 control is returned to the process that requested the voltage location. If it is not, in block 810 the analysis interval is incremented by one.

In block 812, voltage observations for all temperature zones are retrieved for a predetermined analysis interval index.

In block 814, the voltage location for each temperature zone is estimated using L1 median, or by density and expected value.

In block 816, voltage locations are saved for later use in CVR factors calculation. Block 806 is re-executed to determine if the analysis interval is at maximum.

Figure 9A:
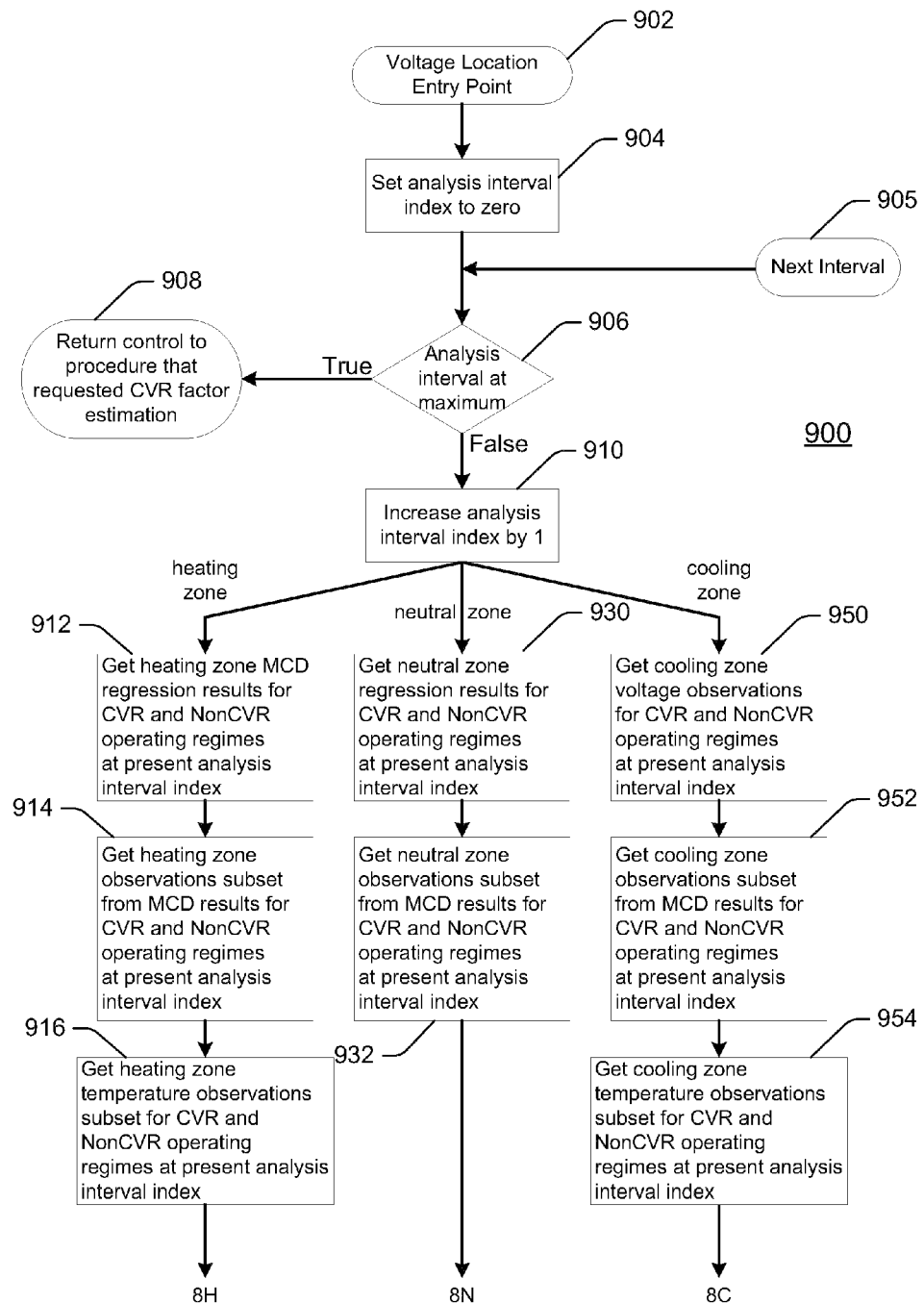
Figure 9B:
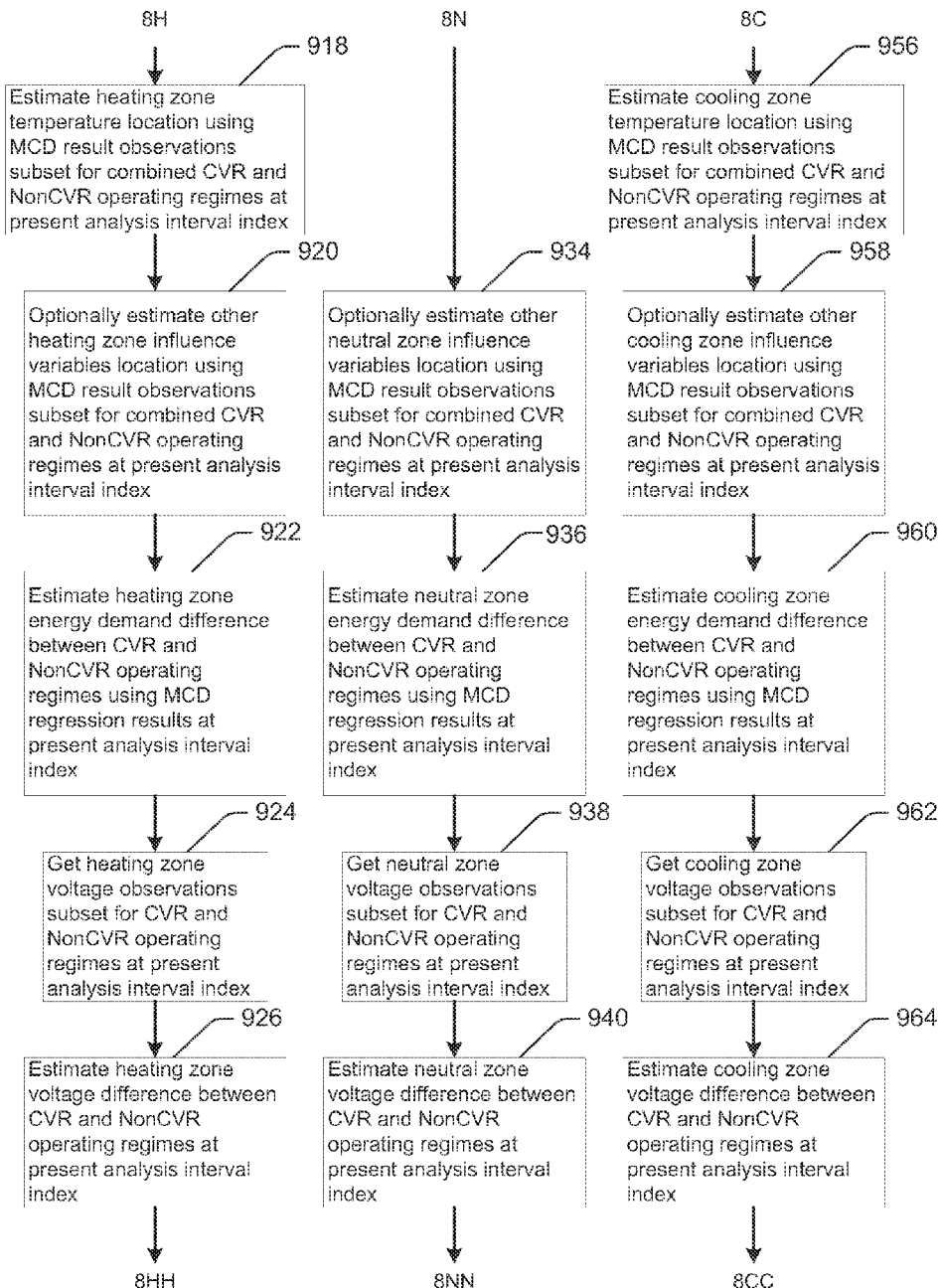
Figure 9C:
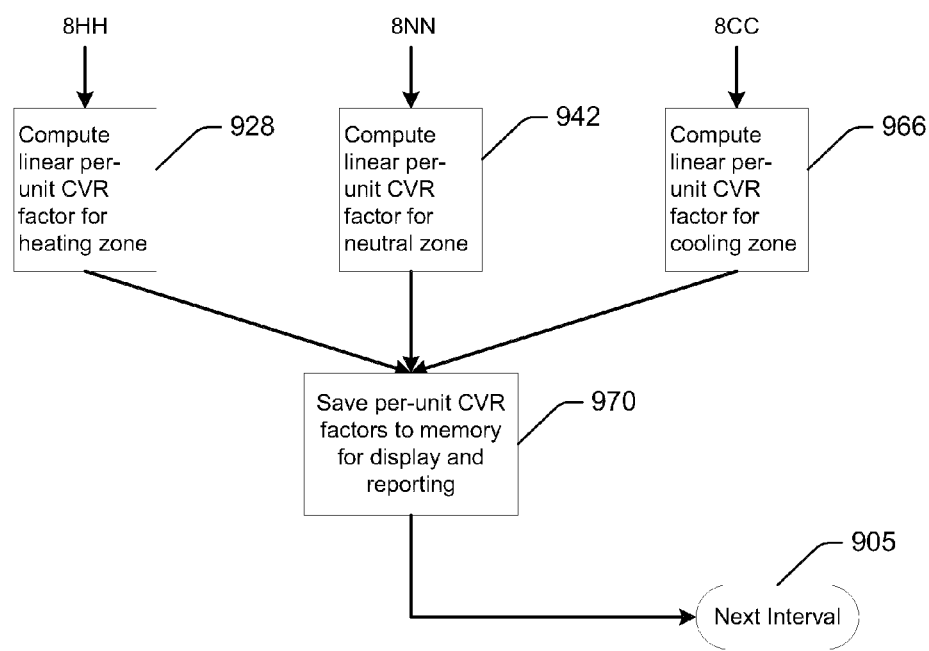

Referring to FIGS. 9A-9C, there is shown process 900 for estimating the estimated CVR factor. In block 902, a voltage location entry point is defined.

In block 904, an analysis interval index is set to zero. The next interval block is executed in block 905.

In block 906, a determination is made whether the analysis interval is a maximum level. If it is, in block 908 control is returned to the process that requested the CVR factor estimation. If it is not, in block 910 the analysis interval is incremented by one. A determination is also made, in block 910, whether the CVR factor corresponds to a heating zone (for example, temperature is below 65), a neutral zone (for example, temperature is between 65 and 70) or a cooling zone (for example, temperature is above 70). If the CVR factor corresponds to a heating zone, then blocks 912-928 are executed, if the CVR factor corresponds to a neutral zone, then block 930-942 are executed, and if the CVR factor corresponds to a cooling zone, then block 950-966 are executed.

In block 912, the heating zone MCD regression results for CVR and Non-CVR operating regimes at present analysis interval index are retrieved.

In block 914, heating zone observations subset from MCD results for CVR and Non-CVR operating regimes at present analysis interval index are retrieved.

In block 916, heating zone temperature observations subset for CVR and Non-CVR operating regimes at present analysis interval index are retrieved.

In block 918, heating zone temperature location using MCD result observations subset for combined CVR and Non-CVR operating regimes at present analysis interval index are estimated.

In block 920, other heating one influence variables location are optionally estimated using MCD result observations subset for combine CVR and Non-CVR operating regimes at present analysis interval index.

In block 922, heating zone energy demand difference between CVR and Non-CVR operating regimes are estimated using MCD regression results at the present analysis interval index.

In block 924, the heating zone voltage observations subset for CVR and Non-CVR operating regimes at present analysis interval index are retrieved.

In block 926, the heating zone voltage difference between CVR and Non-CVR operating regimes is estimated at the present analysis interval index.

In block 928, a linear per unit CVR factor is computed for the heating zone.

In block 930, the neutral zone MCD regression results for CVR and Non-CVR operating regimes at present analysis interval index are retrieved.

In block 932, neutral zone observations subset from MCD results for CVR and Non-cvr operating regimes at present analysis interval index are retrieved.

In block 934, other neutral one influence variables location are optionally estimated using MCD result observations subset for combine CVR and Non-CVR operating regimes at present analysis interval index.

In block 936, neutral zone energy demand difference between CVR and Non-CVR operating regimes are estimated using MCD regression results at the present analysis interval index.

In block 938, the neutral zone voltage observations subset for CVR and Non-CVR operating regimes at present analysis interval index are retrieved.

In block 940, the neutral zone voltage difference between CVR and Non-CVR operating regimes is estimated at the present analysis interval index.

In block 942, a linear per unit CVR factor is computed for the neutral zone.

In block 950, the cooling zone MCD regression results for CVR and Non-CVR operating regimes at present analysis interval index are retrieved.

In block 952, cooling zone observations subset from MCD results for CVR and Non-cvr operating regimes at present analysis interval index are retrieved.

In block 954, cooling zone temperature observations subset for CVR and Non-CVR operating regimes at present analysis interval index are retrieved.

In block 956, cooling zone temperature location using MCD result observations subset for combined CVR and Non-CVR operating regimes at present analysis interval index are estimated.

In block 958, other heating one influence variables location are optionally estimated using MCD result observations subset for combine CVR and Non-CVR operating regimes at present analysis interval index.

In block 960, cooling zone energy demand difference between CVR and Non-CVR operating regimes are estimated using MCD regression results at the present analysis interval index.

In block 962, the cooling zone voltage observations subset for CVR and Non-CVR operating regimes at present analysis interval index are retrieved.

In block 964, the cooling zone voltage difference between CVR and Non-CVR operating regimes is estimated at the present analysis interval index.

In block 966, a linear per unit CVR factor is computed for the cooling zone.

After blocks 928, 942 and 966 the per-unit CVR factors are saved to memory for display ad reporting at block 970. The next interval is then executed in block 905.

Referring to FIG. 10, there is shown process 1000 for implementing an MCD regression. In block 1002, an MCD regression entry point is defined.

In block 1004, an estimator is chosen based on a number of observations in the input ensemble.

If the number of observations is zero, in block 1006, the identify estimate is set as invalid.

If the number of observations is one, in block 1008, an estimate is returned and set to a single response observation with null regression coefficients.

If the number of observations is two, in block 1010, an estimate is returned and set to a mean of two response observations with null regression coefficients.

If the number of observations is three, in block 1012, an estimate is returned and set to L1 median of response observations with null regression coefficients.

If the number of observations is four or more, in block 1014, an estimate is returned and set to MCD regression of all response observations against all influence variables.

In block 1016, a determination is made whether the MCD was successful. If it was not, block 1012 is executed where an estimate is returned and set to L1 median of response observations with null regression coefficients.

In block 1018, the estimate is identified as valid.

In block 1020, control is returned to the procedure that requested the MCD algorithm execution.

In one implementation the individual heating and cooling temperature dependences and use actual (not deviation) temperatures are retained in the forward estimation of demand reductions. This eliminates the calculation of the (dilated) deviation temperatures, but requires that some estimate of "average" temperature (central tendency, L1 median) be made for the heating and cooling zones individually. These so-called average temperatures are then used with the heating and cooling regression coefficients to estimate the heating and cooling demand reductions individually. This ultimately results in characterizing the CVR performance with two factors, not one.

Additionally, since the existence of a so-called neutral temperature zone (in which energy demand manifests no apparent temperature dependence) has been observed in real utility systems, then a third temperature-independent CVR factor can be estimated for this zone. This CVR formulation will provide both more detailed characterization of a CVR estimation experiment and superior predictive performance in the context of utility load growth and dynamic changes in temperature patterns.

Other significant environmental influences in the estimation of the CVR factor, include, but are not limited to:

a. humidity as an independent influence, included in the same way as temperature;

b. temperature and humidity (and in one implementation, wind) combined nonlinearly in a single 'discomfort' variable that captures the combined effect of these two phenomena (particularly significant in warm seasons in some climates);

c. real-time dependence, with as yet unspecified allowance for delay, for solar exposure, observed for estimation purposes with direct sensors for solar incidence or records from meteorological databases for regional cloud cover; of course, the possibility that solar incidence could be nonlinearly combined with temperature, humidity, or both, as an influential variable; and d. influences of these variables will differ when energy demand is driven by heating or cooling.

The effect of any or all such influences just described can be estimated along with the effect of transmission, distribution, or service voltage as a linear or nonlinear influential variable, such that estimating the environmental influences in separate voltage regimes is subsumed in favor of a regression model that includes all influences at once, and the CVR factor (by definition the per unit dependence of energy demand on voltage only) is obtained as the regression coefficients for the voltage variable with all the other influential variables set to some suitably estimated 'average' values, in the very general statistical sense that such 'averages' represent the central tendencies of such variables.

In the examples above an MCD ML algorithm is used to perform regressions on the observed data. The MCD method is a highly robust estimator of multivariate location and scatter. Given an n×p data matrix, its objective is to find h observations (with $n/2 \leq h \leq n$) whose covariance matrix has the lowest determinant. The MCD estimate of location is then the average of these h points, and the scatter estimate is a multiple of their covariance matrix. The MCD has a bounded influence function and can attain the highest possible breakdown value (i.e. 50%) when $h=\lfloor(n+p+1)/2\rfloor$. In addition to being highly resistant to outliers, the MCD is affine equivariant, i.e. the estimates behave properly under affine transformations of the data.

Note that the eigenvalues of a covariance matrix may be interpreted to represent the variance associated with a linear combination. The determinant of a matrix is equivalent to the product of its eigenvalues. The 'goodness-of-fit' of a regression model may be assessed therefore by the magnitude of the determinant of the associated covariance matrix. Accordingly therefore that model for which the covariance matrix determinant is minimized must represent the best fit. In various embodiments, this general recognition is leveraged to provide robust multiple linear regressions of the observed data.

A variety of fast algorithms are available for implementing the MCD technique including FAST-MCD (Rousseeuw, P. J. and Van Driessen, K. (1999), "A Fast Algorithm for the Minimum Covariance Determinant Estimator," Technometrics, 41, pp. 212-223) and Det MCD (HUBERT, M., ROUSSEEUW, P. J. and VERDONCK, T. (2010): A deterministic algorithm for the MCD, available at http.//citeseemist.psu.edu, accessed Feb. 28, 2013). Various embodiments may include any suitable implementation of the MCD technique.

Although the specific example provided above related to estimating CVR factors for a CVR system, it will be apparent to one skilled in the art in view of the present disclosure that these techniques may be extended or modified to analyze other types of conservation systems, include Volt/VAR optimization systems.

The scope of the present invention is not limited by what has been specifically shown and described hereinabove. Those skilled in the art will recognize that there are suitable alternatives to the depicted examples of materials, configurations, constructions and dimensions. Numerous references, including patents and various publications, are cited and discussed in the description of this invention. The citation and discussion of such references is provided merely to clarify the description of the present invention and is not an admission that any reference is prior art to the invention described herein. All references cited and discussed in this specification are incorporated herein by reference in their entirety.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that performs particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The indefinite articles "a" and "an," as used herein in the specification and in the claims, unless clearly indicated to the contrary, should be understood to mean "at least one."

The phrase "or," as used herein in the specification and in the claims, should be understood to mean "either or both" of the elements so conjoined, i.e., elements that are conjunctively present in some cases and disjunctively present in other cases. Multiple elements listed with "or" should be construed in the same fashion, i.e., "one or more" of the elements so conjoined. Other elements may optionally be present other than the elements specifically identified by the "or" clause, whether related or unrelated to those elements specifically identified. Thus, as a non-limiting example, a reference to "A or B", when used in conjunction with open-ended language such as "including" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "or" as defined above. For example, when separating items in a list, "or" or "or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

In the claims, as well as in the specification above, all transitional phrases such as "including," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

All definitions, as defined and used herein, should be understood to control over dictionary definitions, definitions in documents incorporated by reference, and/or ordinary meanings of the defined terms.

Variations, modifications and other implementations of what is described herein will occur to those of ordinary skill in the art without departing from the spirit and scope of the invention. While certain embodiments of the present invention have been shown and described, it will be obvious to those skilled in the art that changes and modifications may be made without departing from the spirit and scope of the invention. The matter set forth in the foregoing description and accompanying drawings is offered by way of illustration only and not as a limitation.

What is claimed is:

1. A method of analyzing the performance of a conservation system for improving the performance of an electrical power delivery system, the method comprising:
   receiving, by a processor of a computing device, first observation information indicative of the performance of the conservation system in a first mode, the first observation information comprising first non-linear data;
   receiving, by the computing device, second observation information indicative of the performance of the conservation system in a second mode, the second observation information comprising second non-linear data;

sorting, by the computing device, the first observation information into a first plurality of categories that each have linear data corresponding to observations of one or more physical conditions associated with the electrical power delivery system;

sorting, by the computing device, the second observation information into a second plurality of categories that each have linear data corresponding to observations of the one or more physical conditions associated with the electrical power delivery system;

performing, by the computing device for each of the first plurality of categories, first separate respective regressions using the first observation information sorted into each of the first plurality of categories to generate a first model of the performance of the conservation system in the first mode, wherein the first separate respective regressions includes analyzing each of the first plurality of categories individually;

performing, by the computing device for each of the second plurality of categories, second separate respective regressions using the second observation information sorted into each of the second plurality of categories to generate a second model of the performance of the conservation system in the second mode wherein the second separate respective regressions includes analyzing each of the second plurality of categories individually;

determining, by the computing device, first controlled performance information indicative of the performance of the conservation system in the first mode based on the first model; and determining, by the computing device, second controlled performance information indicative of the performance of the conservation system in the second mode based on the second model.

2. The method of claim 1, wherein the conservation system comprises a conservation voltage reduction (CVR) system or a Volt/VAR optimization (VVO) system.

3. The method of claim 1, further comprising:
controlling the conservation system to operate in the first and second modes, wherein the first mode is a mode where the conservation system is inactive and the second mode is a mode where the conservation system is active.

4. The method of claim 1, wherein each of the first and second observation information comprises:
explanatory information indicative of at least one explanatory variable for the performance of the conservation system, the explanatory information comprising information indicative of at least one selected from the list consisting of: temperature, humidity, solar conditions, exposure, population, weather conditions, and linear or non-linear combinations of any of the foregoing; and
dependent information indicative of at least one dependent variable for the performance of the conservation system, the dependent information comprising information indicative of at least one selected from the list consisting of: operating voltage, real power demand, VAR demand, or combinations thereof.

5. The method of claim 4, wherein generating each of the first and second models comprises:
performing a regression based on the respective explanatory information and the dependent information, the performing the regression comprising performing at least one selected from the list consisting of: a multiple linear regression, a robust regression algorithm, and a minimum covariance determinant regression algorithm.

6. The method of claim 1, wherein observation information exhibits substantially nonlinear behavior from category to category.

7. The method of claim 6, wherein the one or more physical conditions includes at least one selected from the list consisting of: temperature, humidity, solar conditions, exposure, and weather conditions.

8. The method of claim 6, wherein each of the first plurality of categories and each of the second plurality of categories corresponds to observations of a common usage condition, the common usage condition corresponding to a user population or a user population density.

9. The method of claim 1, wherein the first plurality of categories and the second plurality of categories comprise:
a low temperature category comprising observations corresponding to a zone with relatively low ambient temperatures;
a high temperature category corresponding to a zone with relatively high ambient temperatures; and
a moderate category corresponding to a zone with ambient temperatures intermediate between the low and high temperature zones.

10. The method of claim 9, wherein the low temperature category corresponds to a zone where power from the delivery system is used for heating, and the high temperature category corresponds to a zone where power from the delivery system is used for cooling.

11. The method of claim 1, further comprising:
comparing the performance of the conservation system in the first and second modes using the first and second controlled performance information.

12. The method of claim 11, wherein comparing the performance of the conservation system in the first and second modes comprises using the first and second models to control for differing delivery system operating conditions in the first and second modes, the differing delivery system operating conditions comprising at least one from the list consisting of: temperature, humidity, solar conditions, exposure, population, weather conditions, and linear or non-linear combinations of any of the foregoing.

13. The method of claim 11, wherein the conservation system is a CVR system and comparing the performance of the conservation system in the first and second modes comprises generating information indicative of a CVR factor.

14. The method of claim 11, wherein the conservation system is a Volt/VAR optimization system and comparing the performance of the conservation system in the first and second modes comprises generating information indicative of energy efficiency or demand response.

15. A system for analyzing the performance of a conservation system for improving the performance of an electrical power delivery system, the system comprising:
a processor configured to:
receive first observation information indicative of the performance of the conservation system in a first mode, the first observation information comprising first non-linear data;
receive second observation information indicative of the performance of the conservation system in a second mode, the second observation information comprising second non-linear data;
sort the first observation information into a first plurality of categories that each have linear data corresponding to observations of one or more physical conditions associated with the electrical power delivery system;
sort the second observation information into a second plurality of categories that each have linear data corresponding to observations of the one or more physical conditions associated with the electrical power delivery system;

perform, for each of the first plurality of categories, first separate respective regressions using the first observation information sorted into each of the first plurality of categories to generate a first model of the performance of the conservation system in the first mode, wherein the first separate respective regressions includes analyzing each of the first plurality of categories individually;

perform, for each of the second plurality of categories, second separate respective regressions using the second observation information sorted into each of the second plurality of categories to generate a second model of the performance of the conservation system in the second mode wherein the second separate respective regressions includes analyzing each of the second plurality of categories individually;

determine first controlled performance information indicative of the performance of the conservation system in the first mode based on the first model; and determine second controlled performance information indicative of the performance of the conservation system in the second mode based on the second model.

16. The system of claim 15, wherein the conservation system comprises a conservation voltage reduction (CVR) system or a Volt/VAR optimization (VVO) system.

17. The system of claim 15, further comprising:

a controller configured to control the conservation system to operate in the first and second modes, wherein the first mode is a mode where the conservation system is inactive and the second mode is a mode where the conservation system is active.

18. The system of claim 15, wherein each of the first and second observation information comprises:

explanatory information indicative of at least one explanatory variable for the performance of the conservation system, the explanatory information comprising information indicative of at least one selected from the list consisting of: temperature, humidity, solar conditions, exposure, population, weather conditions, and linear or non-linear combinations of any of the foregoing; and dependent information indicative of at least one dependent variable for the performance of the conservation system, the dependent information comprising information indicative of at least one selected from the list consisting of: operating voltage, real voltage demand, VAR demand, or combinations thereof.

19. The system of claim 15, further comprising:

a plurality of sensors operatively coupled to the processor and configured to generate the observation information, the plurality of sensors including one or more meters located remotely from the processor and in operative communication with the processor.

20. The system of claim 19, wherein the plurality of sensors comprises one or more sensors configured to observe physical conditions at one or more locations in the delivery system, the sensors comprising at least one selected from the list consisting of: a temperature sensor, a humidity sensor, a solar condition sensor, an exposure sensor, a population sensor, a weather condition sensor, and combinations of any of the foregoing.

21. The system of claim 15, wherein the processor is further configured to:

compare the performance of the conservation system in the first and second modes using the first and second controlled performance information.

22. The system of claim 21, wherein the processor is configured to compare the performance of the conservation system in the first and second modes using the first and second models to control for differing delivery system operating conditions in the first and second modes, the differing delivery system operating conditions comprising at least one from the list consisting of:

temperature, humidity, solar conditions, exposure, population, weather conditions, and linear or non-linear combinations of any of the foregoing.

23. The system of claim 15, further comprising a controller operatively connected to the processor, the controller configured to control the operation of the conservation system.

24. A non-transitory computer-readable storage medium comprising processor executable instruction, the instructions comprising instructions to:

receive first observation information indicative of the performance of a conservation system in a first mode, the first observation information comprising first non-linear data;

receive second observation information indicative of the performance of the conservation system in a second mode, the second observation information comprising first non-linear data;

sort the first observation information into a first plurality of categories that each have linear data corresponding to observations of one or more physical conditions associated with the electrical power delivery system;

sort the second observation information into a second plurality of categories that each have linear data corresponding to observations of the one or more physical conditions associated with the electrical power delivery system;

perform, for each of the first plurality of categories, first separate respective regressions using the first observation information sorted into each of the first plurality of categories to generate a first model of the performance of the conservation system in the first mode, wherein the first separate respective regressions includes analyzing each of the first plurality of categories individually;

perform, for each of the second plurality of categories, second separate respective regressions using the second observation information sorted into each of the second plurality of categories to generate a second model of the performance of the conservation system in the second mode wherein the second separate respective regressions includes analyzing each of the second plurality of categories individually;

determine first controlled performance information indicative of the performance of the conservation system in the first mode based on the first model; and determine second controlled performance information indicative of the performance of the conservation system in the second mode based on the second model.

25. The non-transitory computer-readable storage medium of claim 24, wherein the instructions comprise instructions to:

control the conservation system to operate in the first and second modes, wherein the first mode is a mode where the conservation system is inactive and the second mode is a mode where the conservation system is active.

26. The non-transitory computer-readable storage medium of claim 25, wherein each of the first and second observation information comprises:
- explanatory information indicative of at least one explanatory variable for the performance of the conservation system, the explanatory information comprising information indicative of at least one selected from the list consisting of: temperature, humidity, solar conditions, exposure, population, weather conditions, and linear or non-linear combinations of any of the foregoing; and
- dependent information indicative of at least one dependent variable for the performance of the conservation system, the dependent information comprising information indicative of at least one selected from the list consisting of: operating voltage, real voltage demand, VAR demand, or combinations thereof.

27. The non-transitory computer-readable storage medium of claim 26, wherein the instructions to generate each of the first and second models further comprise instructions to:
- perform a regression based on the respective explanatory information and the dependent information, the performing the regression comprising performing at least one selected from the list consisting of: a multiple linear regression, a robust regression algorithm, and a minimum covariance determinant algorithm.

28. The non-transitory computer-readable storage medium of claim 24, wherein the instructions further comprise instructions to:
- compare the performance of the conservation system in the first and second modes using the first and second controlled performance information.

* * * * *